United States Patent [19]

Capasso et al.

[11] Patent Number: 4,794,440
[45] Date of Patent: Dec. 27, 1988

[54] HETEROJUNCTION BIPOLAR TRANSISTOR

[75] Inventors: Federico Capasso, Westfield; Arthur C. Gossard, Warren; John R. Hayes, Plainfield; Roger J. Malik, Summit; Pierre M. Petroff, Westfield, all of N.J.

[73] Assignee: American Telephone and Telegraph Company, AT&T Bell laboratories, Murray Hill, N.J.

[21] Appl. No.: 142,316

[22] Filed: Dec. 30, 1987

Related U.S. Application Data

[63] Continuation of Ser. No. 27,045, Mar. 20, 1987, abandoned, which is a continuation of Ser. No. 497,849, May 25, 1983, abandoned.

[51] Int. Cl.$^4$ .............................................. H01L 29/72
[52] U.S. Cl. ........................................ 357/34; 357/16; 357/58
[58] Field of Search .......................... 357/16, 34, 58, 4

[56] References Cited

U.S. PATENT DOCUMENTS

| | | | |
|---|---|---|---|
| 2,916,639 | 12/1959 | Krembs | 357/58 |
| 2,953,488 | 9/1960 | Shockley | 357/58 X |
| 3,984,858 | 10/1976 | Cornu et al. | 357/58 X |
| 4,007,297 | 2/1977 | Robinson et al. | 357/34 |
| 4,119,994 | 10/1978 | Jain et al. | 357/34 |
| 4,203,124 | 5/1980 | Gordon et al. | 357/16 X |
| 4,353,081 | 10/1982 | Allyn et al. | 357/80 E X |
| 4,396,931 | 8/1983 | Dumke et al. | 357/34 X |
| 4,410,902 | 10/1983 | Malik | 357/13 |
| 4,414,557 | 11/1983 | Amemiya et al. | 357/34 X |
| 4,442,445 | 4/1984 | Malik et al. | 357/58 X |
| 4,482,910 | 11/1984 | Nishizawa et al. | 357/16 X |
| 4,518,979 | 5/1985 | Dumke et al. | 357/16 X |
| 4,539,581 | 9/1985 | Malik et al. | 357/58 |
| 4,578,127 | 3/1986 | Gossard et al. | 357/16 X |

FOREIGN PATENT DOCUMENTS

| | | | |
|---|---|---|---|
| 0114455 | 12/1981 | Japan | 357/34 |
| 0142574 | 8/1983 | Japan | 357/34 |

OTHER PUBLICATIONS

H. Kroemer, "Quasi-Electric and Quasi-Magnetic Fields in Nonuniform Semiconductors," RCA Review, vol. 18, Sep. 1957, pp. 332-342.
H. Beneking et al, "Double Heterojunction NpN GaAlAs/GaAs Bipolar Transistor," Electronics Letters, vol. 18, No. 1, Jan. 7, 1982, pp. 25-26.
D. Ankri et al, "Diffused Epitaxial GaAlAs-GaAs Heterojunction Bipolar Transistor for High-Frequency Operation," Applied Physics Letters, vol. 40, No. 9, May 1, 1982, pp. 816-818.
J. A. Cooper et al., "Semiconductor Structures for Repeated Velocity Overshoot," IEEE Electron Device Letters, vol. EDL-3, No. 12, Dec. 1982, pp. 407-408.
F. Capasso et al, "New Graded Band-Gap Picosecond Phototransistor," Applied Physics Letters, vol. 42, No. 1, Jan. 1983, pp. 93-95.
Streetman, B. G., Solid State Electronic Devices, Prentice-Hall, Inc. 1972, p. 161.
Kroemer, H., "Heterostructure Bipolar Transistors and Integrated Circuits", Proc. of the IEEE, vol. 70, No. 1, Jan. 1982, pp. 64-76.
Kroemer, H., "Theory of a Wide-Gap Emitter for Transistors", Proc. of the IRE, vol. 45, No. 11, Nov. 1957, pp. 1535-1537.
Hovel, H. J., "Graded Bandgap Heterojunction Bipolar Transistor", IBM Tech. Disc. Bull., vol. 22, No. 8B, Jan. 1980, p. 3875.
T. Matsushita et al., "A Silicon Heterojunction Transistor", Appl. Phys Lett 35(7), Oct. 1979.
Ross et al., "Heterojunction GaAs/GaAlAs Transistors with Enhanced Gain from Avalanche Multiplication", IEEE Journal on Solid-State and Elect. Dev., vol. 1, No. 2, pp 53-56, Jan. 1977.

Primary Examiner—Andrew J. James
Assistant Examiner—Sara W. Crane
Attorney, Agent, or Firm—Richard D. Laumann; Peter A. Businger

[57] ABSTRACT

A heterojunction bipolar transistor having means for changing carrier transport properties is described.

6 Claims, 2 Drawing Sheets

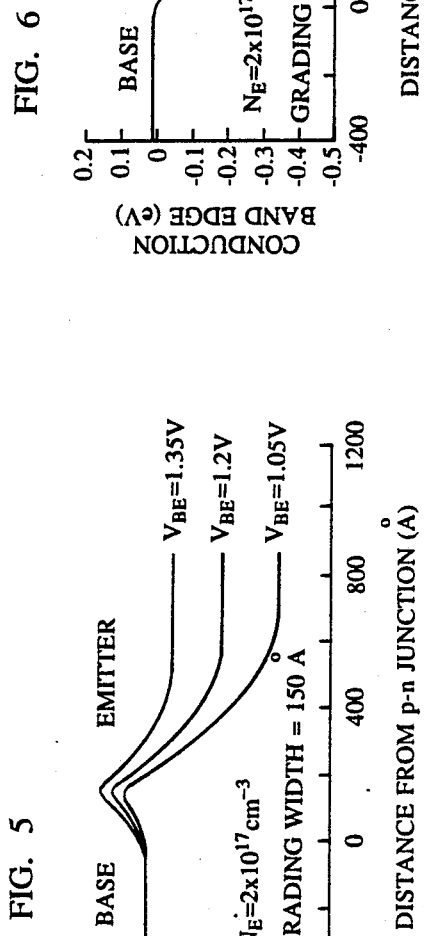
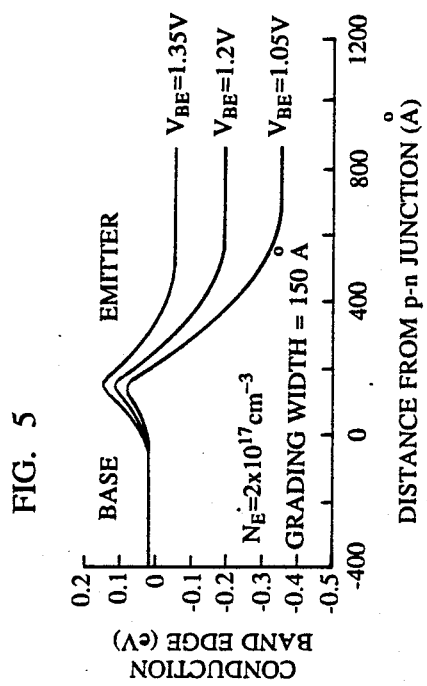
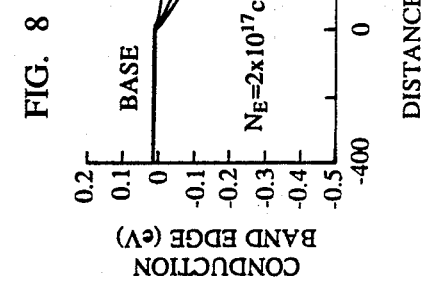
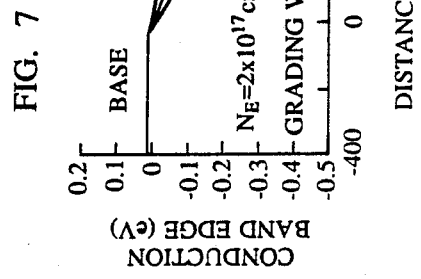
FIG. 5
FIG. 6
FIG. 7
FIG. 8

HETEROJUNCTION BIPOLAR TRANSISTOR

This application is a continuation of application Ser. No. 027,045 filed Mar. 20, 1987 now abandoned which is a continuation of application Ser. No. 497,849 filed May 25, 1983, now abandoned.

TECHNICAL FIELD

This invention relates generally to bipolar transistors and particularly to such heterojunction transistors having, for example, a graded bandgap region which may be the emitter, base, or collector.

BACKGROUND OF THE INVENTION

Bipolar transistors are important components in, for example, logic circuits, communications systems, and microwave devices. A bipolar transistor is essentially a three terminal device having three regions of alternating conductivity type which are commonly referred to as the emitter, base, and collector regions. Since their invention in 1947 at Bell Telephone Laboratories, Incorporated, many proposals have been made in attempts to improve the performance of such transistors with respect to their, for example, speed, power, and frequency characteristics. In particular, many proposals have been made which would improve the performance of such devices so that they would be better suited for high speed applications such as microwave and logic devices.

One such proposal is a transistor with a wide bandgap emitter which is discussed in, for example, *RCA Review*, 18, pp. 332-342, Sept., 1957. A transistor with a wide bandgap emitter has an emitter region in which the bandgap is greater than the bandgap in the base region. An essential feature of the wide bandgap emitter transistor is that the bandgap difference between the emitter region and the base region suppresses hole injection. The result of the suppression is that the wide bandgap emitter transistor has a higher injection efficiency than does a transistor having a constant bandgap in the emitter and base regions. Consequently, the base region may be more heavily doped than the emitter region. As a result, the device has both a lower base resistance and emitter-base capacitance than does a constant bandgap transistor. Both of these characteristics are desirable for high frequency operation but neither one adversely effects the high emitter injection efficiency.

Transistors having wide bandgap emitters are commonly referred to as heterojunction bipolar transistors and have several advantages over, for example, metal semiconductor field effect transistors. The advantages include a larger current-drive capacity per unit area, a smaller sensitivity of switching speed to output loading, and a nearly fixed turn-on voltage.

The above-mentioned paper by Kroemer in the *RCA Review* also mentioned the idea of introducing a quasielectric field in the base region of the transistor. A quasielectric field is one which produces forces on the electrons and holes that are not equal. The quasielectric field results from a crystalline nonuniformity and is conveniently introduced by having a graded bandgap base region. The quasi-electric field reduces the transit time of minority carriers in the base region and leads to an increase in device operating speed.

Other structures for increasing carrier velocity and reducing carrier transit time are known. For example, *IEEE Electron Device Letters*, EDL-3, pp. 407-408, December 1982, teaches repeated velocity overshoot structures. The structures use, for example, graded bandgap regions of thin acceptor and donor regions to achieve velocity overshoot.

The effect of the reduced carrier transit time in the base region was first demonstrated by F. Capasso et al and was disclosed in *Applied Physics Letters*, 42, pp. 93-95, 1983. The device disclosed by Capasso et al was a phototransistor having a wide bandgap emitter and a graded bandgap base region. The device had a response time less than approximately 20 psec. Later studies showed that the electron velocity was as high as $1.8 \times 10^7$ cm/sec in a graded bandgap p+AlGaAs layer. The layer was 0.4 $\mu$m thick and the quasi-electric field was $8.8 \times 10^3$ V/cm.

Other heterojunction bipolar transistors have been disclosed in literature. For example, *Applied Physics Letters*, 40, pp. 816-818, May 1, 1982, discloses such a device which had a constant bandgap base region and was fabricated from the GaAlAs-GaAs materials system using liquid phase epitaxy. High current gains were reported, $\beta$ greater than 2000, with devices having relatively low emitter doping, less than approximately $10^{16}/\text{cm}^3$, and a highly doped base, approximately $10^{18}/\text{cm}^3$. The device also had a relatively high transition frequency, 1.3 GHz, which was obtained with a collector current of 1 mA.

Another heterojunction bipolar transistor was described in *Electronics Letters*, 18, pp. 25-26, Jan. 7, 1982. This device was a double heterojunction transistor which had a wide bandgap collector region as well as a wide bandgap emitter region. The double heterojunction device disclosed eliminated the turn-on voltage of prior devices which was caused by the difference between the built-in voltages of the emitter base heterojunction and the base-collector homojunction.

SUMMARY OF THE INVENTION

We have found that a heterojunction bipolar transistor comprising a wide bandgap emitter region and means for changing the carrier transport properties in at least one of the three regions of the transistors has desirable characteristics. For example, the emitter region may be graded near the emitter-base interface to increase injection efficiency. The transistor comprises a first region having a first bandgap and a first conductivity type, a second region having a second bandgap and a second conductivity type, said second bandgap being less than said first bandgap, a third region having a first conductivity type, and means for changing the carrier transport properties in at least one of said regions. There are also electrical contacts to each of the three regions. In one embodiment, the second region may or may not have a graded bandgap and the emitter region comprises means for changing the carrier transport properties. The means optimizes injection efficiency. For example, the emitter region may be graded near the base-emitter junction over the depletion width at the desired operating voltage or the emitter region may comprise an intrinsic region adjacent the base-emitter interface. In another embodiment, the collector region further comprises means for changing the carrier transport properties such as charge sheets having alternating positive and negative charges to increase the drift velocity in the collector region. The term "carrier transport property" refers to carrier velocity, injection efficiency, etc.

BRIEF DESCRIPTION OF THE DRAWING

FIGS. 5-7 graphically depict, for uniform emitter doping, conduction band edge as functionally related to distance from the base-emitter junction for linear compositional grading over different widths and for different base-emitter forward-bias voltages; and FIG. 8 graphically depicts, for uniform emitter doping, conduction band edge as functionally related to distance from the base-emitter junction for parabolic compositional grading for different base-emitter forward-bias voltages.

For reasons of clarity, the elements of the device are not drawn to scale in the FIGURES.

DETAILED DESCRIPTION

Figure 1:
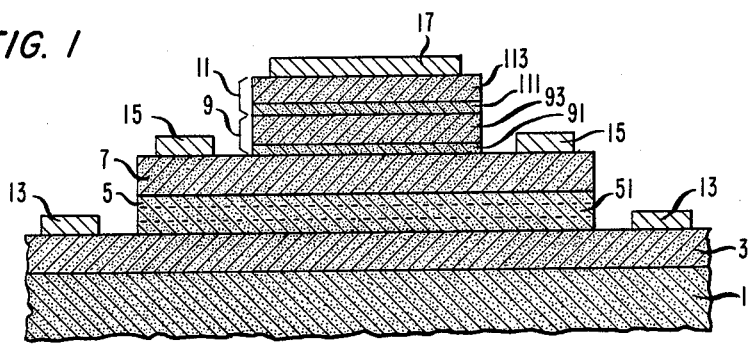
FIG. 1 is a sectional view of one device according to our invention.

One embodiment of a device according to our invention is depicted in sectional view in FIG. 1. The embodiment depicted comprises substrate 1, buffer layer 3, collector region 5, base region 7, emitter region 9, contact region 11, and electrical contacts 13, 15, and 17 made to the collector, base, and emitter regions, respectively. The collector and emitter regions have a first conductivity type and the base region has a second conductivity type. The emitter (first) region which has a wider bandgap than does the base (second) region which has a bandgap that is graded from a first larger value adjacent the emitter region to a second smaller value adjacent the collector (third) region. The first larger value is smaller than the bandgap of the emitter region in the bulk of emitter region and the second smaller value may be larger than the bandgap of the collector region at the base-collector interface.

The collector region further comprises means for changing the carrier transport properties, namely, two regions 51 of ionized donors and acceptors. The region nearest the base should have the same conductivity type as the base while the region farther away should have the opposite conductivity type. The emitter region further comprises means for changing the carrier transport properties, namely, two regions 91 and 93. Region 91 which is adjacent to the base region is graded over a relatively short distance while region 93 has a constant composition. The contact region 11 comprises layers 111, adjacent the emitter, and 113. The former layer may have a graded bandgap to facilitate formation of an ohmic contact.

In one embodiment, the substrate comprised n+ or semi-insulating gallium arsenide and the n-type buffer layer comprised gallium arsenide doped to a density of approximately $2 \times 10^{18}/cm^3$ and was 1.5 μm thick. The n-type GaAs collector region was doped to a density of approximately $5 \times 10^{16}/cm^3$ and was 5000 Angstroms thick. The p-type base region was graded from $GA_{0.98}Al_{0.02}As$ to $Ga_{0.8}Al_{0.2}As$ over a distance of approximately 4000 Angstroms and had a doping concentration of $2 \times 10^{18}/cm^3$. This bandgap grading corresponds to an electric field of approximately 5.6 KV/cm. The n-type emitter region 91 adjacent to the base was graded from $GA_{0.65}Al_{0.35}As$ to $Ga_{0.8}Al_{0.2}As$ near the base over a distance of approximately 500 Angstroms and had a doping concentration of $2 \times 10^{16}/cm^3$. Emitter region 93 comprised $Ga_{0.65}Al_{0.35}As$ and was 3000 Angstroms thick with a doping concentration of $2 \times 10^{16}/cm^3$. Contact region 113 comprised GaAs and region 111 was graded from GaAs to $Ga_{0.65}Al_{0.35}As$. The thicknesses were 1000 and 500 Angstroms, respectively. The doping concentrations were $2 \times 10^{18}/cm^3$.

Other compound semiconductors may also be used. For example, the regions may comprise AlInAs/GaInAs. In another embodiment, the emitter comprised $Al_{0.48}In_{0.52}As$ having a dopant concentration of $5 \times 10^{17}/cm^3$ and the collector comprised n-type $Ga_{0.47}In_{0.53}As$ having a dopant concentration of $5 \times 10^{16}/cm^3$. The base comprised p-type GaInAs having a dopant concentration of $5 \times 10^{18}/cm^3$. The base and collector widths were 2500 and 5000 Angstroms, respectively. The embodiment comprising a graded emitter had a graded quaternary emitter layer 600 Angstroms thick comprising GaAlInAs in addition to a constant bandgap $Al_{0.48}In_{0.52}As$ region. This layer was linearly graded between the two ternary layers.

In these embodiments, the first conductivity type is n-type and the second conductivity type is p-type leading to a n-p-n transistor. It is to be understood that a p-n-p transistor may also be fabricated. It will also be readily appreciated that the epitaxial layers may be grown on an insulating or semi-insulating substrate.

Devices made showed virtually identical characteristics. The AlGaAs/GaAs transistors had a maximum current gain of approximately 35 with a base current of 1.6 mA. There was a very small collector/emitter offset voltage which was required before transistor operation was observed. At higher current levels, there is a marked decrease in gain as $V_{CE}$ increases. This was due to a heating effect which could be removed by pulsing the collector-emitter voltage. The heating effect can be understood by remembering that the gain decreases exponentially as the temperature is increased. The current gain described should be regarded by those skilled in the art as excellent as it was obtained with approximately ⅓ emitter base bandgap difference and approximately 1/10 emitter doping level of recent state of the art AlGaAs/GaAs heterojunction bipolar transistors. The structure disclosed combines the advantages of the wide bandgap emitter and the graded bandgap base transistors. The AlInAs/InGaAs transistors had current gains of several hundred.

The transistors comprising the epitaxial layers are conveniently grown by molecular beam epitaxy. The epitaxial layers comprise Group II-VI or III-V compound semiconductors which may be binary, ternary or quaternary. For example, the layers, i.e., regions, may comprise AlGaAs or AlInAs. Use of this growth technique is well known to those skilled in the art and need not be described in detail. The graded bandgap regions may be grown by appropriately varying the temperature of at least one effusion oven and the thin acceptor and donor regions may be grown by increasing the dopant flux for a time sufficient to fabricate the regions.

After the epitaxial layers are grown, additional and conventional processing is used to complete device fabrication. For example, electrical contacts are made by using two etching steps after the epitaxial layers are grown. The base region is exposed by using successive growth and removal of an anodic oxide. The collector region is exposed using a standard nonselective etch of $10H_2O:8H_2SO_4$. Au—Sn contacts are evaporated on the emitter and collector regions and an Au—Be contact is evaporated on the base region. These contacts were made ohmic with a short alloy.

The advantages, i.e., the improvements in carrier transport properties, resulting from grading region 91 may be better understood from the following considerations. If there is no grading in region 91, there is a conduction band spike. However, grading of region 91 allows most of the bandgap difference to fall across the valence band. The width of the graded emitter region is roughly equal to the depletion layer width on the emitter side at the operating voltage of interest. This is desirable because it minimizes the turn-on voltage and maximizes the hole confinement thus leading to higher injection efficiency.

Figure 2:
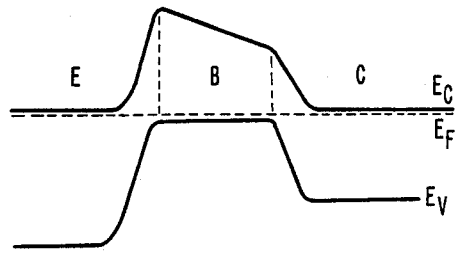
FIG. 2 shows the energy band diagram for the emitter, base, and collector regions of the device depicted in FIG. 1.

The energy band diagram for the device of FIG. 1 is shown in FIG. 2 under equilibrium (no injection) conditions for the emitter, base, and collector regions which are indicated as E, B, and C, respectively. The conduction and valence bands are designated $E_C$ and $E_V$, respectively, and the Fermi level by the dashed line designated $E_F$.

Figure 3:
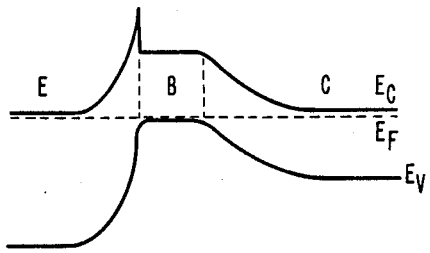
FIGS. 3 and 4 show the energy band diagram for the emitter, base, and collector regions for two illustrative devices according to our invention.
Figure 4:
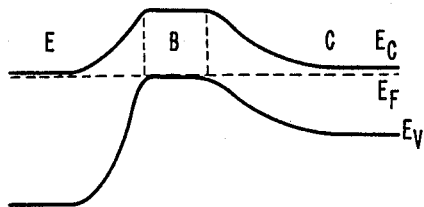

The energy band diagrams are depicted in FIG. 3 and FIG. 4 for transistors having an abrupt emitter and a graded bandgap emitter, respectively. Although the base region is depicted as having a constant bandgap, it will be readily appreciated that the base region may also have a graded bandgap. The emitter, base, and collector regions are designated E, B, and C, respectively. The conduction band and the valence band are shown as $E_C$ and $E_V$, respectively, and the Fermi level is represented by the dashed line designated $E_F$.

As is apparent, the grading in the emitter region removes the conduction band notch at the emitter-base junction. This leads to a larger emitter-base valence band difference under forward bias injection.

The usefulness of the abrupt emitter in the (Al,In)As/(Ga,In)As system is much greater than in the (Al,Ga)As/GaAs system. This is true because the valence band discontinuity in the latter system is too small to suppress hole injection while it is large enough in the former system to do so.

Still other embodiments are contemplated. For example, the emitter region adjacent the base region may comprise an intrinsic region, i.e., i-type region. It is to be understood that i-type means nominally undoped with very low background doping. The grading in this configuration is over the distance of the i-type region. The grading may be linear.

In more general terms, preferred grading is complementary to the electrostatic potential corresponding to a base-emitter voltage in a desired range, so that the sum of the electrostatic potential and the grading potential is essentially constant at least in a portion of the emitter depletion region. Since, in the case of uniform emitter doping, the electrostatic potential varies parabolically with distance, linear grading results in unwanted structure such as spikes and notches in the conduction band (FIGS. 5-7) which may reduce injection efficiency by promoting carrier recombination. On the other hand, preferred complementary grading—parabolic in this case—produces a smoothed conduction band edge (FIG. 8), eliminates the conduction band spike, and yields transistors having a higher $\beta$.

We have found that reproducibility in the composition of the graded layers, for example, the base region, is sometimes difficult to obtain when the fluxes from the individual ovens are varied by varying the effusion oven temperatures. We have found that both the reproducibility and accuracy of the compositions of the graded layers, as well as their doping concentrations, can be greatly improved by using a chopped molecular beam, i.e., the beam from at least one of the ovens is turned off and on by moving a shutter in front of and away from the oven opening. The thickness and compositions of the graded regions are controlled by controlling the opening and closing of a shutter in front of at least one of the effusion ovens. For example, the shutter in front of an Al effusion cell may be used to chop the Al beam and grow alternating GaAs and AlGaAs layers. Thus, the graded region comprises a first plurality of layers of a first compound semiconductor interleavened with a second plurality of a second compound semiconductor. The average composition of a series of epitaxial layers is equal to the desired graded composition. It will be readily appreciated that the compositions of the first and second pluralities change to accomplish the grading. This is accomplished by varying the time the shutter is open. For example, in a graded bandgap AlGaAs/GaAs region, 20 successive bilayers will have progressively thicker or thinner AlGaAs sections and respectively thinner or thicker GaAs sections as the aluminum concentration increases or decreases.

The individual layers should be kept less than the electron tunneling distance. This limit is imposed because the electrons should not be substantially confined in the individual layers. For AlGaAs layers, the layers should be less than approximately 30 Angstroms in thickness. Thus, the electrons feel an average potential in the conduction band and valence band which is approximately equal to the potential of the random alloy of comparable average composition. Additionally, the compositional control is now achieved by accurate and reproducible computer controlled shutter action and, therefore, the compositional profiles can be accurately reproducibly obtained. Finally, the GaAs layers generally exceed one monolayer and thus produce a smoothing and cleaning effect which should increase the carrier mobilities and decrease impurity scattering and impurity composition.

The graded base region may have a high density of recombination centers which are undesirable because they reduce device gain. We hypothesize that the recombination centers are associated with precipitates caused by the dopants and precipitate-induced defects. However, since GaAs can be doped to $10^{20}/cm^3$ with Be and yield good quality devices, we believe that precipitates form more readily in GaAlAs. The precipitates are reduced in number, if not totally eliminated in the graded base, by doping only the binary compound semiconductor to a high concentration and not doping the ternary compound semiconductor. This procedure may be conveniently termed "selectively doped ramping."

In yet another embodiment, the collector region described may be further modified to comprise means for changing the carrier transport properties. As has been mentioned, the collector region may comprise sheets of alternating positive and negative charges, i.e., donor and acceptor regions commonly referred to as alternating planar doped charge sheets, to obtain high carrier velocities. Appropriate choice of the base-collector voltage results in repeated velocity overshoot in the collector region. A single dipole moment, that is, a positive and a negative charge sheet, may be placed several hundred Angstroms from the base-collector junction. If $\sigma$ is the doping density and d is the distance between the charge sheets, then the potential step in the conduction band is $eod/\epsilon$, where $\epsilon$ is the dielectric constant. The potential step in the conduction band should not exceed the intervalley separation. A single region may be used with a conductivity type opposite to that of the base.

As electrons enter the dipole region, they experience a rapid acceleration and are essentially ballistically shifted in energy and velocity. In a typical configuration, the collector region has a thickness of approximately 5000 Angstroms and the dipole is positioned approximately 100 Angstroms from the base-collector junction with $\sigma$ equal to approximately $6 \times 10^{11}/cm^2$ and d is approximately 200 Angstroms.

Additionally modifications will be readily thought of by those skilled in the art. For example, the collector region may have a graded bandgap to enhance carrier velocity. Additionally, there may be conduction band discontinuities in the collector region which enhance the carrier velocity. This is accomplished by a plurality of graded bandgap regions. The grading is from a low bandgap near the base to a high bandgap away from the base. Further, the transit time for carriers in a graded bandgap base region may be maintained at the same value as in a comparable transistor having an ungraded base region but with a thicker base region and therefore a reduced base resistance. It is also to be readily appreciated that other methods may be used to fabricate the electrical contacts.

What is claimed is:

1. A bipolar transistor comprising a first region having a first conductivity type and a first bandgap; a second region having a second conductivity type and a second bandgap, said first bandgap being greater than said second bandgap; a third region having said first conductivity type, said first, second, and third regions being emitter, base, and collector regions, respectively; and electrical contacts to said first, second, and third regions.

CHARACTERIZED IN THAT the emitter depletion region corresponding to a base-emitter bias voltage in a desired range comprises a fourth region in which composition is graded complementary to the electrostatic potential corresponding to said voltage, whereby the sum of the functions representing said electrostatic potential and the grading potential is essentially constant in said fourth region.

2. The transistor of claim 1 in which said emitter region is essentially uniformly doped, and in which said composition is graded essentially parabolic.

3. The transistor of claim 1 in which said emitter region comprises an n-region, and an i-region adjacent to said base region, and in which said composition is graded essentially linear.

4. The transistor of claim 1, 2 or 3 in which said base region comprises a fifth region which is compositionally graded.

5. The transistor of claim 4 in which said fifth region is coextensive with said base region.

6. The transistor of claim 1 in which said collector region further comprises at least one ionized donor-or-acceptor region.

* * * * *